United States Patent [19]

Draxelmayr

[11] Patent Number: 4,875,018
[45] Date of Patent: Oct. 17, 1989

[54] CURRENT MIRROR CIRCUIT ASSEMBLY

[75] Inventor: Dieter Draxelmayr, Villach, Austria

[73] Assignee: Siemens Aktiengesellschaft, Berlin and Munich, Fed. Rep. of Germany

[21] Appl. No.: 99,104

[22] Filed: Sep. 18, 1987

[30] Foreign Application Priority Data

Sep. 24, 1986 [DE] Fed. Rep. of Germany ....... 3632432

[51] Int. Cl.[4] ............................................. H03F 3/16
[52] U.S. Cl. .................................. 330/288; 323/316; 323/317
[58] Field of Search ................ 330/257, 288; 323/315, 323/316, 317

[56] References Cited

U.S. PATENT DOCUMENTS 3,904,976  9/1975  Ahmed ................................ 330/257
4,423,387 12/1983  Sempel ............................ 330/288 X

FOREIGN PATENT DOCUMENTS 2071951  9/1981  United Kingdom .

OTHER PUBLICATIONS

Patent Abstracts of Japan, vol. 3, No. 155, (E-160) Dec. 19, 1979, p. 128 E 160.

*Primary Examiner*—James B. Mullins
*Attorney, Agent, or Firm*—Herbert L. Lerner; Laurence A. Greenberg

[57] ABSTRACT

A current mirror circuit assembly includes a first current mirror circuit formed of an input transistor connected as a diode and a mirror transistor. The input transistor and the mirror transistor have gate terminals connected to one another and output circuits with output terminals. One of the output terminals of each of the input transistor and the mirror transistor are connected to a supply potential. A regulating transistor has an output circuit connected in series with the output circuit of the mirror transistor. A second current mirror circuit is formed of transistors with output circuits. Other transistors are controlled by the other of the output terminals of a respective one of the input transistor and the mirror transistor. One of the other transistors is fed back to the regulating transistor and the other transistors are connected to the output circuits of the transistors of the second current mirror circuit.

6 Claims, 1 Drawing Sheet

CURRENT MIRROR CIRCUIT ASSEMBLY

The invention relates to a current mirror circuit assembly having a current mirror comprising an input transistor connected as a diode and a mirror transistor, which are connected to one another with their gate terminals and with one output terminal each are connected to a supply potential, and having a regulating transistor the output circuit of which is in series with the output circuit of the mirror transistor.

Current mirror circuits are used in virtually all analog circuits, especially in integrated circuitry. In a simple current mirror, which is usually formed of two transistors, one of the transistors is connected as a diode and the control terminals of the transistors are connected to one another. The output current of such a circuit is dependent on the output voltage, that is the current mirror has a low differential output resistance.

Various possibilities exist for increasing the differential output resistance. First, the channel length of the mirror transistor through which the output current flows can be increased. However, this method is only effective for small transistors and low currents, because the channel width must also be increased with increasingly stringent demands, so that the surface area required by the transistor increases disproportionately. A second possibility is to cascade the mirror transistors, which does greatly increase the differential output resistance, but also means that a greater voltage reserve or working voltage must be made available, because the transistors are operated at saturation.

A third possibility is the use of an operational amplifier, as shown in the drawing. A high differential output resistance is attainable with such a circuit and the residual voltage supply potential can also be kept low. However, an operational amplifier requires a significantly greater expenditure in terms of circuitry and the dynamics of the current mirror circuit are determined by the dynamics of the operational amplifier, which is poor by comparison with simple current mirror circuits.

It is accordingly an object of the invention to provide a current mirror circuit assembly, which overcomes the hereinafore-mentioned disadvantages of the heretofore-known devices of this general type, which is simple and which has a low residual voltage drop and a high differential output resistance, with good dynamics.

With the foregoing and other objects in view there is provided, in accordance with the invention, a current mirror circuit assembly, comprising a first current mirror circuit formed of an input transistor connected as a diode and a mirror transistor, the input transistor and the mirror transistor having gate terminals connected to one another and output circuits with output terminals, one of the output terminals of each of the input transistor and the mirror transistor being connected to a supply potential, a regulating transistor having an output circuit connected in series with the output circuit of the mirror transistor, a second current mirror circuit formed of transistors with output circuits, other transistors each being controlled by the other of the output terminals of a respective one of the input transistor and the mirror transistor, one of the other transistors being fed back to the regulating transistor, and the other transistors being connected to the output circuits of the transistors of the second current mirror circuit.

In accordance with another feature of the invention, the other transistors have output circuits with output terminals and one of the output terminals of each of the other transistors is connected to the supply potential.

In accordance with a further feature of the invention, the transistors of the first current mirror and the other transistors are of one conduction type, and the transistors of the second current mirror circuit are of the other conduction type.

In accordance with an added feature of the invention, the transistors of second current mirror circuit are input and mirror transistors, and the regulating transistor is controlled by the other of the output terminals of the other transistor connected to the output circuit of the mirror transistor of the second current mirror circuit.

In accordance with an additional feature of the invention, there is provided a third current mirror circuit connected in series with the second current mirror circuit.

In accordance with a concomitant feature of the invention, the third current mirror circuit is formed of input and mirror transistors, and there are provided shutoff means having additional transistors of different conduction types with respective output circuits being connected in parallel with the output circuit of the other transistor fed back to the regulating transistor and being connected in series with the output circuit of the mirror transistor at least one of the second and third current mirror circuits, the additional transistors having gate terminals being connected together and controlled to provide reciprocal shutoff.

Other features which are considered as characteristic for the invention are set forth in the appended claims.

Although the invention is illustrated and described herein as embodied in a current mirror circuit assembly, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
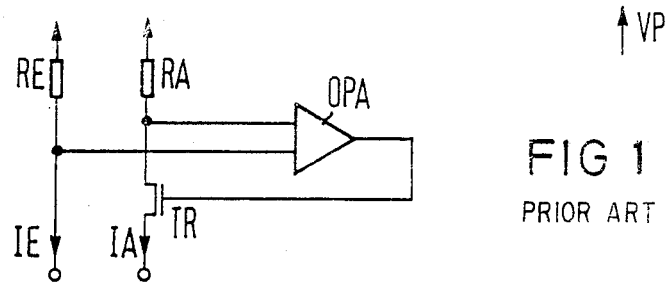
FIG. 1 is a schematic circuit diagram of a prior art current mirror assembly.

Referring now in detail to the figures of the drawings in which identical elements are identified with the same reference numerals and first, particularly, to FIG. 1 thereof, there is seen a current mirror formed of an input resistor RE and an output resistor RA, which are connected in common to a supply potential VP as indicated by the legend at the right side of FIG. 1. An input current IE and an output current IA respectively flow through the resistors. The potentials of the terminals on the load side of the two resistors are compared with the aid of an operational amplifier OPA. The output of the operational amplifier OPA controls a regulating transistor TR, having an output circuit in series with the resistor RA.

As mentioned above, a high differential output resistance is attainable with the circuit according to FIG. 1.

The residual voltage, that is the voltage between the supply potential and the output terminal on the load side of the regulating transistor TR can also be kept low. However, the operational amplifier OPA requires an expenditure in terms of circuitry which is not insignificantly greater and at the same time the dynamics of the current mirror circuit are determined by the dynamics of the operational amplifier, which is poor by comparison with simple current mirror circuits.

Figure 2:
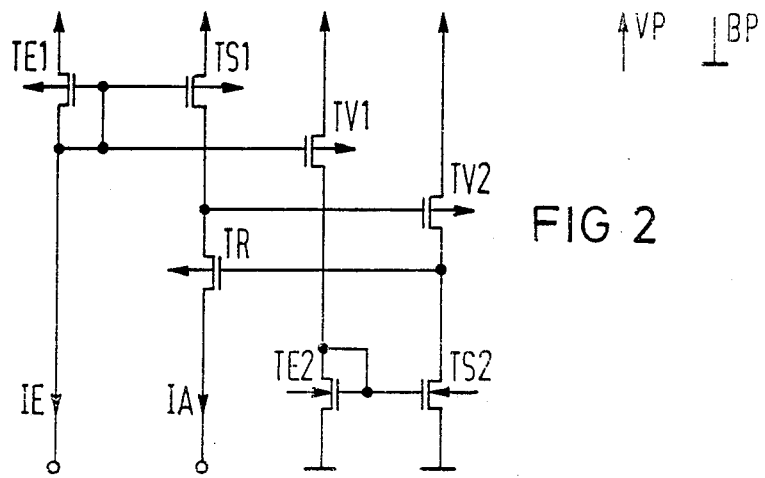
FIG. 2 is a circuit diagram of an embodiment of a current mirror circuit assembly according to the invention.

As shown in FIG. 2, the two resistors that form the current mirror in FIG. 1 are replaced by transistors TE1 and TS1. These two transistors already form a first current mirror, because the control terminals thereof are connected with one another, the transistor TE1 is connected as a diode and one output terminal of each of the two transistors is connected to the supply potential VP. Therefore, while the input current IE flows through the transistor TE1, the output current IA flows through the mirror transistor TS1 and the output circuit of the regulating transistor TR is connected in series with the output circuit of the transistor TS1.

The current mirror formed of the two transistors TE1 and TS1 functions ideally if all of the corresponding transistor voltages are identical. In such a case, there is a forced output current IA that is only dependent on the translation ratio of the transistors. Due to the physical embodiment of the circuitry, the gate and source potentials of the respective transistors in FIG. 2 are already identical. Similarly, if integrated circuit technology is used, the bulk potentials are identical.

In accordance with the invention, the drain potential of the transistor TS1 is regulated with the aid of the regulating transistor TR to a point where it is identical with the drain potential of the transistor TE1. To this end, the two drain potentials of the transistors TE1 and TS1 control the control inputs of two other transistors TV1 and TV2, each of which have a respective output terminal connected to the supply potential VP. The other output terminal of the transistor TV2 controls the input of the regulating transistor TR, producing a feedback regulating circuit. The output circuits of the transistors TV1 and TV2 are connected in series with the output circuits of further transistors TE2 and TS2, which form a further or second current mirror. To this end, the transistor TE2 is connected as a diode.

The portion of the circuit that is required for the feedback, namely the transistors TV1, TV2, TE2 and TS2, forms a structure similar to an operational amplifier, which is already functionally integrated with the actual current mirror circuit assembly, so that no bias stages or potential adaptation stages are required. The feedback circuit portion formed of the further current mirror and the comparison transistors TV1 and TV2 is then in balance whenever the gate potentials of the transistors TV1 and TV2 are the same. However, this also means that the drain potentials of the transistors TE1 and TS1 are also the same. This feedback and regulating mechanism functions even if the regulating transistor TR is operated in the resistance range, resulting in a lower voltage than with cascading.

For example, if the drain potential of the transistor TS1 drops as compared with the drain potential of the transistor TE1, because of a higher output current IA, then the transistor TV2 conducts better and a higher voltage appears at the gate terminal of the regulating transistor TR. This higher voltage reduces the output current of the regulating transistor and thus the output current IA of the current mirror. The transistors TE1 and TS1 of the current mirror as well as the transistors TV1 and TV2, are of the same type, namely p-channel transistors, in the illustrated embodiment. The transistors TE2 and TS2 of the further current mirror are of the other type, that is the n-channel type. Thus, one of the output terminals of each of the transistors TE1, TS1, TV1 and TV2 can be connected to the reference potential VP, as a result of which bias stages are not needed for the regulation, as noted above.

Figure 3:
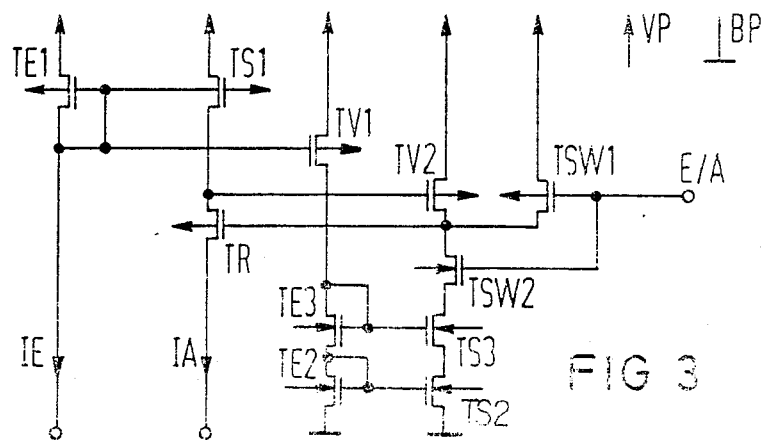
FIG. 3 is another embodiment of a current mirror circuit assembly according to the invention having a cascaded comparison current mirror and means for switching the entire current mirror on and off.

FIG. 3 shows another embodiment of a current mirror circuit assembly according to the invention, which differs from FIG. 2 in that an additional or third current mirror formed of transistors TE3 and TS3 is connected in series with the further current mirror formed of the transistors TE2 and TS2; the transistors TE3 and TS3 are all of the n-channel type. The transistor TE3 is connected as a diode. As a result, there is a high differential output resistance for the further current mirror, which it will be recalled serves as a comparison current mirror; this output resistance effects a greater amplification and thus provides greater precision, while the residual voltage does not play a critical role in this comparison current mirror.

The embodiment of FIG. 3 also differs from that of FIG. 2 in that output circuits of transistors TSW1 and TSW2 are connected in parallel with to the output circuit of the transistor TV2 and in series with the output circuits of the transistors TS2 and TS3. The transistors TSW1 and TSW2 are connected to one another and to a terminal E/A at the control terminals thereof. The transistor TSW1 is of the p-channel type, while the transistor TSW2 is of the n-channel type. The output side of the transistor TSW2 is located between the output circuits of the transistors TV2 and TS3. The circuit assembly according to the invention can either be operated in its normal mode or it can be switched off with the aid of the two switch transistors TSW1 and TSW2. To this end, a control potential at the terminal E/A is used to either conductively saturate the transistor TSW2 while the transistor TSW1 blocks, or to conductively saturate the transistor TSW1, so that the transistor TSW2 and the regulating transistor TR are both in the blocking state at the same time.

The foregoing is a description corresponding in substance to German Application P No. 36 32 432.9, dated Sept. 24, 1986, the International priority of which is being claimed for the instant application, and which is hereby made part of this application. Any material discrepancies between the foregoing specification and the aforementioned corresponding German application are to be resolved in favor of the latter.

I claim:

1. Current mirror circuit assembly, comprising a first current mirror circuit formed of a first input transistor connected as a diode and a first mirror transistor, said input transistor and said mirror transistor having gate terminals connected to one another and output circuits with output terminals, one of said output terminals of each of said input transistor and said mirror transistor being connected to a supply potential, a regulating transistor having an output circuit connected in series with said output circuit of said mirror transistor, a second current mirror circuit formed of respective second input and mirror transistors with respective output circuits, other transistors each having respective gates, each being controlled by another one of said output terminals of a respective one of said first input transistor and said first mirror transistor, one of said other transistors having a feedback connected to said regulating transistor, and said other transistors being connected to said output circuits of said second transistors of said second current mirror circuit.

2. Current mirror according to claim 1, wherein said other transistors have output circuits with output terminals and one of said output terminals of each of said other transistors is connected to the supply potential.

3. Current mirror according to claim 1, wherein said transistors of said first current mirror and said other transistors are of one conduction type, and said transistors of said second current mirror circuit are of the other conduction type.

4. Current mirror according to claim 2, wherein said regulating transistor is controlled by an output terminal of one of said other transistors connected to said output circuit of said second mirror transistor of said second current mirror circuit.

5. Current mirror according to claim 4, including a third current mirror circuit connected in series with said second current mirror circuit.

6. Current mirror according to claim 5, wherein said third current mirror circuit is formed of respective third input and mirror transistors with respective output circuits, and including shutoff means having additional transistors of different conduction types with respective output circuits being connected in parallel with said output circuit of said other transistor having a feedback to said regulating transistor and being connected in series with said output circuit of the mirror transistor of at least one of said second and third current mirror circuits, said additional transistors having gate terminals being connected together and controlled to provide reciprocal shutoff.

* * * * *